(12) United States Patent
Sun et al.

(10) Patent No.: US 10,504,601 B2
(45) Date of Patent: Dec. 10, 2019

(54) SHIFT REGISTER UNIT, DRIVING METHOD THEREOF, GATE DRIVING CIRCUIT AND DISPLAY DEVICE

(71) Applicants: BOE TECHNOLOGY GROUP CO., LTD., Beijing (CN); HEFEI BOE OPTOELECTRONICS TECHNOLOGY CO., LTD., Anhui (CN)

(72) Inventors: Li Sun, Beijing (CN); Jian Tao, Beijing (CN); Hongmin Li, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 15/820,101

(22) Filed: Nov. 21, 2017

(65) Prior Publication Data

US 2018/0286490 A1 Oct. 4, 2018

(30) Foreign Application Priority Data

Apr. 1, 2017 (CN) .......................... 2017 1 0215801

(51) Int. Cl.
*G11C 19/28* (2006.01)
*G09G 5/10* (2006.01)
(Continued)

(52) U.S. Cl.
CPC .......... *G11C 19/28* (2013.01); *G09G 3/3266* (2013.01); *G09G 5/10* (2013.01); *G11C 19/184* (2013.01);
(Continued)

(58) Field of Classification Search
CPC ......... G09G 2310/0286; G09G 3/3266; G09G 2310/0267; G09G 2/10; G11C 19/28
See application file for complete search history.

(56) References Cited

U.S. PATENT DOCUMENTS 9,576,524 B2  2/2017  Kim et al.
2011/0157263 A1*  6/2011  Kim ..................... G09G 3/3677
                                                         345/698
(Continued)

FOREIGN PATENT DOCUMENTS

CN  102800289 A  11/2012
CN  104078017 A  10/2014
(Continued)

OTHER PUBLICATIONS

First Office Action for Chinese Application No. 201710215801.3, dated Mar. 21, 2019, 9 Pages.

*Primary Examiner* — Kent W Chang
*Assistant Examiner* — Sujit Shah
(74) *Attorney, Agent, or Firm* — Brooks Kushman P.C.

(57) ABSTRACT

A shift register unit, a driving method thereof, a gate driving circuit and a display device are provided. The shift register unit includes an input circuit, a resetting circuit, a pull-down node control circuit, a storage circuit, a gate driving signal output circuit, and a pull-up node potential maintaining circuit. The pull-up node potential maintenance circuit is connected to a gate driving signal output end and a pull-up node, and configured to maintain a potential at the pull-up node to be a high level when the gate driving signal output end outputs a gate driving signal at a high level.

15 Claims, 2 Drawing Sheets

(51) Int. Cl.
*G11C 19/18* (2006.01)
*G09G 3/3266* (2016.01)

(52) U.S. Cl.
CPC .............. *G09G 2310/0267* (2013.01); *G09G 2310/0286* (2013.01)

(56) References Cited

U.S. PATENT DOCUMENTS

| | | | |
|---|---|---|---|
| 2015/0339999 A1* | 11/2015 | Zheng | G11C 19/28 345/92 |
| 2015/0365085 A1* | 12/2015 | Qing | H03K 17/302 345/100 |
| 2015/0371716 A1* | 12/2015 | Shao | G11C 19/287 345/100 |
| 2016/0086562 A1* | 3/2016 | Tan | G09G 3/3677 345/215 |
| 2016/0133337 A1 | 5/2016 | Gu | |
| 2016/0172054 A1 | 6/2016 | Shao et al. | |
| 2016/0322116 A1* | 11/2016 | Jang | G09G 3/20 |

FOREIGN PATENT DOCUMENTS

| | | |
|---|---|---|
| CN | 104332146 A | 2/2015 |
| CN | 104392704 A | 3/2015 |
| CN | 106097949 A | 11/2016 |
| CN | 106504719 A | 3/2017 |

\* cited by examiner

SHIFT REGISTER UNIT, DRIVING METHOD THEREOF, GATE DRIVING CIRCUIT AND DISPLAY DEVICE

CROSS-REFERENCE TO RELATED APPLICATION

This application claims priority to Chinese Patent Application No. 201710215801.3 filed on Apr. 1, 2017, which is incorporated herein by reference in its entirety.

TECHNICAL FIELD

The present disclosure relates to the field of display driving technology, in particular to a shift register unit, a driving method thereof, a gate driving circuit and a display device.

BACKGROUND

Currently, a gate driving technology on the basis of a principle of a shift register unit has been widely used. A gate electrode is driven through a circuit unit, so as to, on one hand, save space, thereby to achieve a narrow-bezel design, and on the other hand, reduce the number of binding processes, thereby to reduce the manufacture cost and the improve the yield as well as the production capacity.

Stability of a gate driving circuit is a key factor for normal display. The gate driving circuit includes a plurality of shift register units connected in a cascaded manner, and an output signal of each shift register unit is controlled by a pull-up node and a clock signal, so an erroneous output of the shift register unit may be caused by a signal noise and a leakage current of a thin film transistor (TFT).

SUMMARY

A main object of the present disclosure is to provide a shift register unit, a driving method thereof, a gate driving circuit and a display device, so as to maintain a potential at an internal node under a feedback effect of a gate driving signal output end, thereby to improve the output stability of the gate driving signal.

In one aspect, the present disclosure provides in some embodiments a shift register unit, including: an input circuit connected to a signal input end, a first voltage end and a pull-up node; a resetting circuit connected to a resetting end, a second voltage end and the pull-up node; a pull-down node control circuit connected to the pull-up node, a pull-down node, a first voltage end and a third voltage end; a storage circuit, a first end of which is connected to the pull-up node, and a second end of which is connected to a gate driving signal output end; a gate driving signal output circuit connected to the pull-up node, the pull-down node, the gate driving signal output end, a clock signal input end and the third voltage end; and a pull-up node potential maintenance circuit connected to the gate driving signal output end and the pull-up node and configured to maintain a potential at the pull-up node to be a high level when the gate driving signal output end outputs a gate driving signal at a high level.

In a possible embodiment of the present disclosure, the pull-up node potential maintenance circuit includes a potential maintenance transistor, a gate electrode of which is connected to the gate driving signal output end, a first electrode of which is connected to the clock signal input end or the first voltage end, and a second electrode of which is connected to the pull-up node.

In a possible embodiment of the present disclosure, the pull-down node control circuit includes: a first pull-down node control transistor, a gate electrode and a first electrode of which are connected to the first voltage end, and a second electrode of which is connected to the pull-down node; and a second pull-down node control transistor, a gate electrode of which is connected to the pull-up node, a first electrode of which is connected to the pull-down node, and a second electrode of which is connected to the third voltage end.

In a possible embodiment of the present disclosure, the pull-down node control circuit further includes a third pull-down node control transistor, a gate electrode of which is connected to the pull-up node, a first electrode of which is connected to the pull-down node, and a second electrode of which is connected to the third voltage end.

In a possible embodiment of the present disclosure, the input circuit includes an input transistor, a gate electrode of which is connected to the signal input end, a first electrode of which is connected to the first voltage end, and a second electrode of which is connected to the pull-up node.

In a possible embodiment of the present disclosure, the resetting circuit includes a resetting transistor, a gate electrode of which is connected to the resetting end, a first electrode of which is connected to the pull-up node, and a second electrode of which is connected to the second voltage end.

In a possible embodiment of the present disclosure, the gate driving signal output circuit includes: a pull-up transistor, a gate electrode of which is connected to the pull-up node, a first electrode of which is connected to the clock signal input end, and a second electrode of which is connected to the gate driving signal output end; and a pull-down transistor, a gate electrode of which is connected to the pull-down node, a first electrode of which is connected to the gate driving signal output end, and a second electrode of which is connected to the third voltage end.

In a possible embodiment of the present disclosure, the storage circuit includes a storage capacitor, a first end of which is connected to the pull-up node, and a second end of which is connected to the gate driving signal output end.

In a possible embodiment of the present disclosure, a second voltage applied to the second voltage end is smaller than a third voltage applied to the third voltage end.

In a possible embodiment of the present disclosure, the second voltage applied to the second voltage end is equal to the third voltage applied to the third voltage end.

In another aspect, the present disclosure provides in some embodiments a method for driving the above-mentioned shift register unit, including a step of, when the gate driving signal output end outputs a gate driving signal at a high level, maintaining, by the pull-up node potential maintenance circuit, a potential at the pull-up node to be a high level.

In a possible embodiment of the present disclosure, the method further includes: at an input stage of each display period, enabling, by the input circuit, the pull-up node to be electrically connected to the first voltage end, charging the storage circuit via the first voltage end so as to pull up the potential at the pull-up node to be a high level, and enabling, by the gate driving signal output circuit, the gate driving signal output end to be electrically connected to the clock signal input end under the control of the pull-up node, so as to enable the gate driving signal output end to output the gate driving signal at a low level; at an output stage of each display period, bootstrapping, by the storage circuit, the potential at the pull-up node, and enabling, by the gate driving signal output circuit, the gate driving signal output end to be electrically connected to the clock signal input end under the control of the pull-up node, so as to enable the gate driving signal output end to output the gate driving signal at a high level; at a resetting stage of each display period, enabling, by the resetting circuit, the pull-up node to be electrically connected to the second voltage end, enabling, by the gate driving signal output end, the gate driving signal output end to be electrically disconnected from the clock signal input end under the control of the pull-up node, enabling, by the pull-down node control circuit, the pull-up node to be electrically connected to the first voltage end, and enabling, by the gate driving signal output circuit, the gate driving signal output end to be electrically connected to the third voltage end under the control of the pull-down node, so as to enable the gate driving signal output end to output the gate driving signal at a low level; and at an output cut-off maintenance stage of each display period, enabling, by the pull-down node control circuit, the pull-down node to be electrically connected to the first voltage end, and enabling, by the gate driving signal output circuit, the gate driving signal output end to be electrically connected to the third voltage end under the control of the pull-down node, so as to enable the gate driving signal output end to continuously output the gate driving signal at a low level.

In yet another aspect, the present disclosure provides in some embodiments a gate driving circuit, including a plurality of the above-mentioned shift register units connected in a cascaded manner.

In a possible embodiment of the present disclosure, during forward scanning, apart from a first-level shift register unit, a signal input end of a current-level shift register unit is connected to a gate driving signal output end of a previous-level shift register unit, and apart from a last-level shift register unit, a resetting end of the current-level shift register unit is connected to a gate driving signal output end of a next-level shift register unit. During backward scanning, apart from the last-level shift register unit, the signal input end of the current-level shift register unit is connected to the gate driving signal output end of the next-level shift register unit, and apart from the first-level shift register unit, the resetting end of the current-level shift register unit is connected to the gate driving signal output end of the previous-level shift register unit.

In still yet another aspect, the present disclosure provides in some embodiments a display device including the above-mentioned gate driving circuit.

According to the shift register unit, the driving method thereof, the gate driving circuit and the display device in the embodiments of the present disclosure, as compared with the related art, due to a feedback effect of the gate driving signal, is it able to control and compensate for the potential at the pull-up node of the shift register unit, thereby to output the gate driving signal stably, and ensure the normal display.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Transistors adopted in all the embodiments of the present disclosure may be TFTs, field effect transistors (FETs) or any other elements having a similar characteristic.

Figure 1:
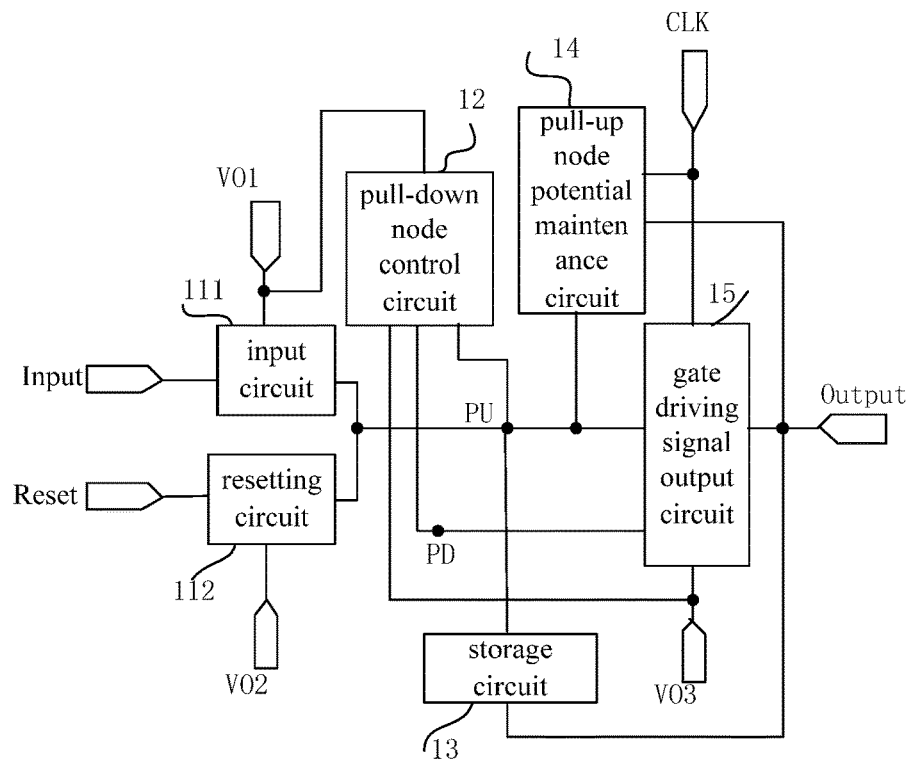
FIG. 1 is a schematic view showing a shift register unit according to at least one embodiment of the present disclosure.

The present disclosure provides in some embodiments a shift register unit which, as shown in FIG. 1, includes: an input circuit 111 connected to a signal input end Input, a first voltage end VO1 and a pull-up node PU; a resetting circuit 112 connected to a resetting end Reset, a second voltage end VO2 and the pull-up node PU; a pull-down node control circuit 12 connected to the pull-up node PU, a pull-down node PD, a first voltage end VO1 and a third voltage end VO3; a storage circuit 13, a first end of which is connected to the pull-up node PU, and a second end of which is connected to a gate driving signal output end Output; a gate driving signal output circuit 15 connected to the pull-up node PU, the pull-down node PD, the gate driving signal output end Output, a clock signal input end CLK and the third voltage end VO3; and a pull-up node potential maintenance circuit 14 connected to the gate driving signal output end Output and the pull-up node PU and configured to maintain a potential at the pull-up node PU to be a high level when the gate driving signal output end Output outputs a gate driving signal at a high level.

According to the shift register unit in the embodiments of the present disclosure, the potential at the pull-up node PU is maintained by the pull-up node potential maintenance circuit 14 to be a high level when the gate driving signal output end Output outputs the gate driving signal at a high level. As a result, it is able to turn on a pull-up transistor of the gate driving signal output circuit 15, thereby to improve output stability of the gate driving signal.

In addition, due to a feedback effect of the gate driving signal from the gate driving signal output end Output, it is able to control and compensate for the potential at the pull-up node of the shift register unit, thereby to output the gate driving signal stably and ensure the normal display.

In actual use, the first voltage end VO1 may be a high level end configured to receive a high level VDD, the second voltage end VO2 may be a first low level end configured to receive a first low level VSS, and the third voltage end VO3 may be a second low level end configured to receive a second low level VGL.

During the implementation, the input circuit is configured to, at an input stage, enable the first voltage end to be electrically connected to the pull-up node under the control of the signal input end. The resetting circuit is configured to, at a resetting stage, enable the pull-up node to be electrically connected to the second voltage end under the control of the resetting end. The pull-down node control circuit is configured to, when the potential at the pull-up node is a high level, enable the pull-down node to be electrically connected to the third voltage end, and when the potential at the pull-up node is a low level, enable the pull-down node to be electrically connected to the first voltage end. The gate driving signal output circuit is configured to, when the potential at the pull-up node is a high level, enable the gate driving signal output end to be electrically connected to the clock signal input end, and when the potential at the pull-down node is a high level, enable the gate driving signal output end to be electrically connected to the third voltage end.

To be specific, the pull-up node potential maintenance circuit may include a potential maintenance transistor, a gate electrode of which is connected to the gate driving signal output end, a first electrode of which is connected to the clock signal input end or the first voltage end, and a second electrode of which is connected to the pull-up node.

In actual use, the potential maintenance transistor is an n-type transistor.

During the implementation, the first electrode and the second electrode refer to two electrodes other than the gate electrode. For example, when the first electrode is a source electrode, the second electrode is a drain electrode, and when the first electrode is the drain electrode, the second electrode is the source electrode.

Figure 2:
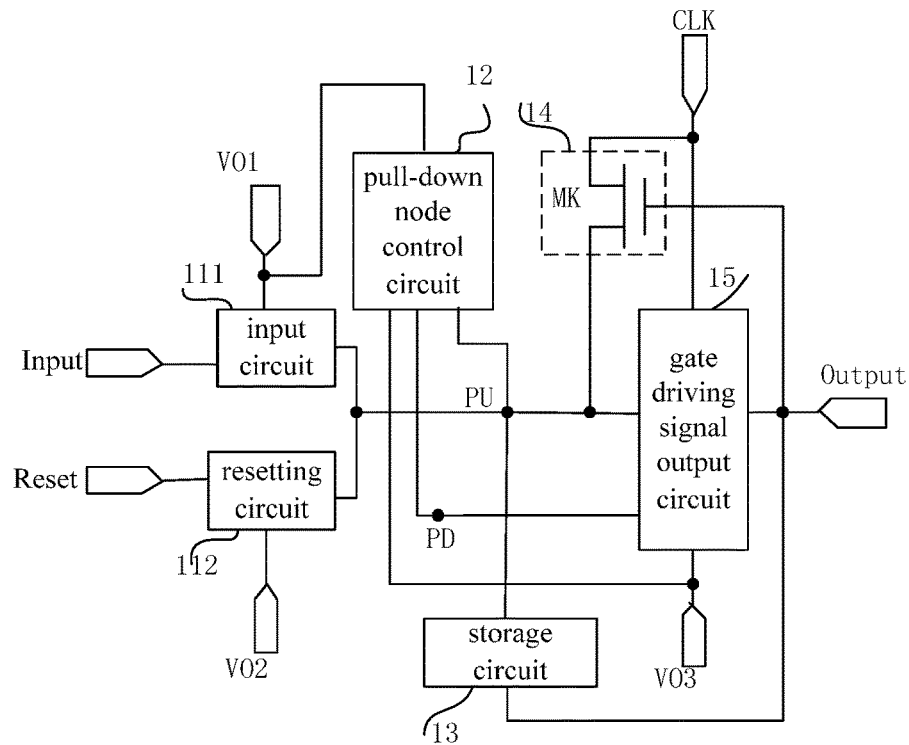
FIG. 2 is another schematic view showing the shift register unit according to at least one embodiment of the present disclosure.

As show in FIG. 2, based on the shift register unit in FIG. 1, the pull-up node potential maintenance circuit 14 includes a potential maintenance transistor MK, a gate electrode of which is connected to the gate driving signal output end Output, a drain electrode of which is connected to the clock signal input end CLK, and a source electrode of which is connected to the pull-up node PU. In actual use, the potential maintenance transistor MK is an n-type transistor.

When Output outputs the gate driving signal at a high level, MK is turned on. At this time, a high level is applied to CLK, so it is able to further pull up the potential at PU. In actual use, the drain electrode of MK may also be connected to the high level end, and at this time, it is also able to maintain the potential at the pull-up node PU when Output outputs the gate driving signal at a high level.

To be specific, the pull-down node control circuit may include: a first pull-down node control transistor, a gate electrode and a first electrode of which are connected to the high level end, and a second electrode of which is connected to the pull-down node; and a second pull-down node control transistor, a gate electrode of which is connected to the pull-up node, a first electrode of which is connected to the pull-down node, and a second electrode of which is connected to the third voltage end.

In actual use, the first pull-down node control transistor and the second pull-down node control transistor are both n-type transistors.

When the potential at the pull-up node is a high level, the first pull-down node control transistor and the second pull-down node control transistor are both turned on, and a width-to-length ratio of the first pull-down node control transistor and a width-to-length ratio of the second pull-down node control transistor may be set, so as to pull down the potential at the pull-down node to be a low level. When the potential at the pull-up node is a low level, the potential at the pull-down node may be pulled up to a high level because the first pull-down node control transistor is turned on.

In a possible embodiment of the present disclosure, the pull-down node control circuit may further include a third pull-down node control transistor, a gate electrode of which is connected to the pull-up node, a first electrode of which is connected to the pull-down node, and a second electrode of which is connected to the third voltage end. Through the second pull-down node control transistor and the third pull-down node control transistor which have same connection relationship, it is able to improve the pulling-down and driving capability.

In a possible embodiment of the present disclosure, the input circuit includes an input transistor, a gate electrode of which is connected to the signal input end, a first electrode of which is connected to the first voltage end, and a second electrode of which is connected to the pull-up node. The resetting circuit includes a resetting transistor, a gate electrode of which is connected to the resetting end, a first electrode of which is connected to the pull-up node, and a second electrode of which is connected to the second voltage end.

During forward scanning, the input end is connected to the gate driving signal output end of a previous-level shift register unit, and the resetting end is connected to the gate driving signal output end of a next-level shift register unit.

During backward scanning, the input end is connected to the gate driving signal output end of the next-level shift register unit, and the resetting end is connected to the gate driving signal output end of the previous-level shift register unit.

In actual use, the input transistor and the resetting transistor may be both n-type transistors.

To be specific, the gate driving signal output circuit may include: a pull-up transistor, a gate electrode of which is connected to the pull-up node, a first electrode of which is connected to the clock signal input end, and a second electrode of which is connected to the gate driving signal output end; and a pull-down transistor, a gate electrode of which is connected to the pull-down node, a first electrode of which is connected to the gate driving signal output end, and a second electrode of which is connected to the third voltage end. In actual use, the pull-up transistor and the pull-down transistor may be both n-type transistors. The storage circuit includes a storage capacitor, a first end of which is connected to the pull-up node, and a second end of which is connected to the gate driving signal output end.

In a possible embodiment of the present disclosure, a second voltage applied to the second voltage end is smaller than a third voltage applied to the third voltage end. When the second voltage is smaller than the third voltage, it is able to turn off the pull-down transistor in a better manner when the potential at the pull-down node is a low level.

In actual use, the second voltage (a first low level) may be equal to the third voltage (a second low level).

The shift register unit will be described hereinafter in conjunction with the embodiments.

Figure 3:
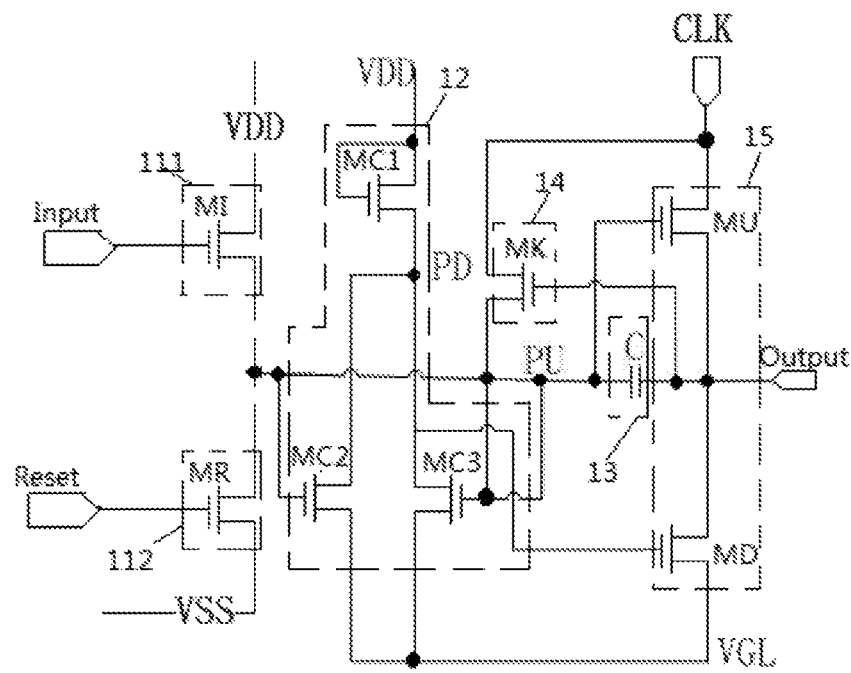
FIG. 3 is a circuit diagram of the shift register unit according to at least one embodiment of the present disclosure.

As shown in FIG. 3, the shift register unit includes the input circuit 111, the resetting circuit 112, the pull-down node control circuit 12, the storage circuit 13, the pull-up node potential maintenance circuit 14 and the gate driving signal output circuit 15.

The input circuit 111 includes an input transistor MI, a gate electrode of which is connected to the signal input end Input, a drain electrode of which is connected to the high level end to which a high level VDD is applied, and a source electrode of which is connected to the pull-up node PU.

The resetting circuit 112 includes a resetting transistor MR, a gate electrode of which is connected to the resetting end Reset, a drain electrode of which is connected to the pull-up node PU, and a source electrode of which is connected to the first low level end to which a first low level VSS is applied.

The pull-down node control circuit 12 includes: a first pull-down node control transistor MC1, a gate electrode and a drain electrode of which are connected to the high level end to which the high level VDD is applied, and a source electrode of which is connected to the pull-down node PD; a second pull-down node control transistor MC2, a gate electrode of which is connected to the pull-up node PU, a drain electrode of which is connected to the pull-down node PD, and a source electrode of which is connected to the second low level end to which a second low level VGL is applied; and a third pull-down node control transistor MC3, a gate electrode of which is connected to the pull-up node PU, a drain electrode of which is connected to the pull-down node PD, and a source electrode of which is connected to the second low level end to which the second low level VGL is applied.

The storage circuit 13 includes a storage capacitor C, a first end of which is connected to the pull-up node PU, and a second end of which is connected to the gate driving signal output end Output.

The pull-up node potential maintenance circuit 14 includes a potential maintenance transistor MK, a gate electrode of which is connected to the gate driving signal output end Output, a drain electrode of which is connected to the clock signal input end CLK, and a source electrode of which is connected to the pull-up node PU.

The gate driving signal output circuit 15 includes: a pull-up transistor MU, a gate electrode of which is connected to the pull-up node PU, a drain electrode of which is connected to the clock signal input end CLK, and a source electrode of which is connected to the gate driving signal output end Output; and a pull-down transistor MD, a gate electrode of which is connected to the pull-down node PD, a drain electrode of which is connected to the gate driving signal output end Output, and a source electrode of which is connected to the second low level end to which the second low level VGL is applied.

All the transistors in FIG. 3 are n-type transistors.

In FIG. 3, through MC2 and MC3 which have same connection relationship, it is able to improve the pulling-down and driving capability.

In FIG. 3, the shift register unit is in a forward scanning state. The input end Input is connected to the gate driving signal output end of the previous-level shift register unit, and the resetting end Reset is connected to the gate driving signal output end of the next-level shift register unit. A clock signal from the CLK is an alternating current, periodic signal, a duty ratio of which is adjustable.

Figure 4:
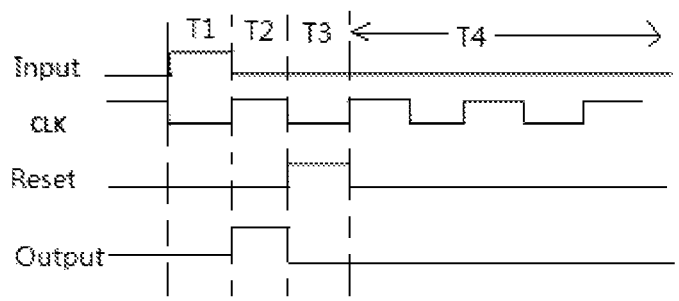
FIG. 4 is a time sequence diagram of the shift register unit according to at least one embodiment of the present disclosure.

As shown in FIG. 4, during the operation of the shift register unit in FIG. 3, at an input stage T1 of each display period, a high level is applied to Input, a low level is applied to CLK and a low level is applied to Reset, so as to turn on MI and turn off MR. C is charged by VDD through MI, so as to pull up the potential at the pull-up node PU. MC1 and MC2 are both turned on, so as to pull down the potential at PD, thereby to turn off MD and turn on MU. At this time, Output is electrically connected to CLK, so as to output a low level.

At an output stage T2 of each display period, a low level is applied to Input, a high level is applied to CLK and a low level is applied to Reset, so as to turn off MI and MR. Due to a bootstrapping effect of the storage capacitor C, the potential at the pull-up node PU is still maintained as a high level, so as to turn on MU. Output outputs a high level, so as to turn on MK. The potential at PU is compensated with a high level signal from Output, so as to eliminate the influence of a leakage current on the potential at the pull-up node. In addition, MC2 and MC3 pull down the potential at the pull-down node PD continuously, so as to enable MU to be in an on state.

At a resetting stage T3 of each display period, a low level is applied to Input, a low level is applied to CLK, and a high level is applied to Reset, so as to turn off MI and turn on MR. The potential at PU is pulled down to VSS, so as to turn off MC2 and MC3. The potential at PD is pulled up by MC1 to VDD, so as to turn off MU and turn on MD, thereby to perform noise reduction on Output and ensure output accuracy in this row. At this time, Output outputs a low level VGL.

At an output cut-off maintenance stage T4 of each display period, a low level is applied to Input, a low level is applied to Reset, and a high level and a low level are applied to CLK periodically, so as to turn off MI and MR. MC2 and MC3 are turned off, and the potential at PD is pulled up by MC1 continuously to VDD, so as to turn off MU and turn on MD. Output continuously outputs the low level VGL until the beginning of the next display period.

During the implementation, a TFT size of MI is same with a TFT size of MR, and the signals may be replaced with each other (i.e., VSS may be applied to the drain electrode of MI and VDD may be applied to the source electrode of MR), so as to achieve backward scanning.

The present disclosure further provides in some embodiments a method for driving the above-mentioned shift register unit, which includes a step of, when the gate driving signal output end outputs a gate driving signal at a high level, maintaining, by the pull-up node potential maintenance circuit, a potential at the pull-up node to be a high level.

To be specific, the method further includes: at an input stage of each display period, enabling, by the input circuit, the pull-up node to be electrically connected to the first voltage end, charging the storage circuit via the first voltage end so as to pull up the potential at the pull-up node to be a high level, and enabling, by the gate driving signal output circuit, the gate driving signal output end to be electrically connected to the clock signal input end under the control of the pull-up node, so as to enable the gate driving signal output end to output the gate driving signal at a low level; at an output stage of each display period, bootstrapping, by the storage circuit, the potential at the pull-up node, and enabling, by the gate driving signal output circuit, the gate driving signal output end to be electrically connected to the clock signal input end under the control of the pull-up node, so as to enable the gate driving signal output end to output the gate driving signal at a high level; at a resetting stage of each display period, enabling, by the resetting circuit, the pull-up node to be electrically connected to the second voltage end, enabling, by the gate driving signal output end, the gate driving signal output end to be electrically disconnected from the clock signal input end under the control of the pull-up node, enabling, by the pull-down node control circuit, the pull-up node to be electrically connected to the first voltage end, and enabling, by the gate driving signal output circuit, the gate driving signal output end to be electrically connected to the third voltage end under the control of the pull-down node, so as to enable the gate driving signal output end to output the gate driving signal at a low level; and at an output cut-off maintenance stage of each display period, enabling, by the pull-down node control circuit, the pull-down node to be continuously electrically connected to the first voltage end, and enabling, by the gate driving signal output circuit, the gate driving signal output end to be continuously electrically connected to the third voltage end under the control of the pull-down node, so as to enable the gate driving signal output end to continuously output the gate driving signal at a low level.

The present disclosure further provides in some embodiments a gate driving circuit including a plurality of the above-mentioned shift register units connected in a cascaded manner.

To be specific, during forward scanning, apart from a first-level shift register unit, a signal input end of a current-level shift register unit is connected to a gate driving signal output end of a previous-level shift register unit, and apart from a last-level shift register unit, a resetting end of the current-level shift register unit is connected to a gate driving signal output end of a next-level shift register unit. During backward scanning, apart from the last-level shift register unit, the signal input end of the current-level shift register unit is connected to the gate driving signal output end of the next-level shift register unit, and apart from the first-level shift register unit, the resetting end of the current-level shift register unit is connected to the gate driving signal output end of the previous-level shift register unit.

The present disclosure further provides in some embodiments a display device including the above-mentioned gate driving circuit.

The pull-up node and the pull-down node disclosed in the present disclosure are not only limited to the connection points of circuits, they also include that circuits connected to the pull-up node or the pull-down node are directly connected to each other.

The above are merely the preferred embodiments of the present disclosure, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A shift register unit, comprising:
an input circuit connected to a signal input end, a first voltage end and a pull-up node;
a resetting circuit connected to a resetting end, a second voltage end and the pull-up node;
a pull-down node control circuit connected to the pull-up node, a pull-down node, the first voltage end and a third voltage end;
a storage circuit, a first end of the storage circuit is connected to the pull-up node, and a second end of the storage circuit is connected to a gate driving signal output end;
a gate driving signal output circuit connected to the pull-up node, the pull-down node, the gate driving signal output end, a clock signal input end and the third voltage end; and
a pull-up node potential maintenance circuit connected to the gate driving signal output end and the pull-up node and configured to maintain a potential at the pull-up node to be a high level when the gate driving signal output end outputs a gate driving signal at a high level,
wherein the pull-up node potential maintenance circuit comprises a potential maintenance transistor, a gate electrode of the potential maintenance transistor is connected to the gate driving signal output end, a first electrode of the potential maintenance transistor is connected to the clock signal input end or the first voltage end, and a second electrode of the potential maintenance transistor is connected to the pull-up node.

2. The shift register unit according to claim 1, wherein the pull-down node control circuit comprises: a first pull-down node control transistor, a gate electrode and a first electrode of the first pull-down node control transistor are connected to the first voltage end, and a second electrode of the first pull-down node control transistor is connected to the pull-down node; and a second pull-down node control transistor, a gate electrode of the second pull-down node control transistor is connected to the pull-up node, a first electrode of the second pull-down node control transistor is connected to the pull-down node, and a second electrode of the second pull-down node control transistor is connected to the third voltage end.

3. The shift register unit according to claim 2, wherein the pull-down node control circuit further comprises a third pull-down node control transistor, a gate electrode of the third pull-down node control transistor is connected to the pull-up node, a first electrode of the third pull-down node control transistor is connected to the pull-down node, and a second electrode of the third pull-down node control transistor is connected to the third voltage end.

4. The shift register unit according to claim 1, wherein the input circuit comprises an input transistor, a gate electrode of the input transistor is connected to the signal input end, a first electrode of the input transistor is connected to the first voltage end, and a second electrode of the input transistor is connected to the pull-up node.

5. The shift register unit according to claim 1, wherein the resetting circuit comprises a resetting transistor, a gate electrode of the resetting transistor is connected to the resetting end, a first electrode of the resetting transistor is connected to the pull-up node, and a second electrode of the resetting transistor is connected to the second voltage end.

6. The shift register unit according to claim 2, wherein the gate driving signal output circuit comprises: a pull-up transistor, a gate electrode of the pull-up transistor is connected to the pull-up node, a first electrode of the pull-up transistor is connected to the clock signal input end, and a second electrode of the pull-up transistor is connected to the gate driving signal output end; and a pull-down transistor, a gate electrode of the pull-down transistor is connected to the pull-down node, a first electrode of the pull-down transistor is connected to the gate driving signal output end, and a second electrode of the pull-down transistor is connected to the third voltage end.

7. The shift register unit according to claim 3, wherein the gate driving signal output circuit comprises: a pull-up transistor, a gate electrode of the pull-up transistor is connected to the pull-up node, a first electrode of the pull-up transistor is connected to the clock signal input end, and a second electrode of the pull-up transistor is connected to the gate driving signal output end; and a pull-down transistor, a gate electrode of the pull-down transistor is connected to the pull-down node, a first electrode of the pull-down transistor is connected to the gate driving signal output end, and a second electrode of the pull-down transistor is connected to the third voltage end.

8. The shift register unit according to claim 6, wherein the storage circuit comprises a storage capacitor, a first end of the storage capacitor is connected to the pull-up node, and a second end of the storage capacitor is connected to the gate driving signal output end.

9. The shift register unit according to claim 7, wherein the storage circuit comprises a storage capacitor, a first end of the storage capacitor is connected to the pull-up node, and a second end of the storage capacitor is connected to the gate driving signal output end.

10. The shift register unit according to claim 8, wherein a second voltage applied to the second voltage end is smaller than a third voltage applied to the third voltage end.

11. A method for driving the shift register unit according to claim 1, comprising a step of, when the gate driving signal output end outputs a gate driving signal at a high level, maintaining, by the pull-up node potential maintenance circuit, a potential at the pull-up node to be a high level.

12. The method according to claim 11, further comprising:
- at an input stage of each display period, enabling, by the input circuit, the pull-up node to be electrically connected to the first voltage end, charging the storage circuit via the first voltage end to pull up the potential at the pull-up node to be a high level, and enabling, by the gate driving signal output circuit, the gate driving signal output end to be electrically connected to the clock signal input end under the control of the pull-up node, to enable the gate driving signal output end to output the gate driving signal at a low level;
- at an output stage of each display period, bootstrapping, by the storage circuit, the potential at the pull-up node, and enabling, by the gate driving signal output circuit, the gate driving signal output end to be electrically connected to the clock signal input end under the control of the pull-up node, to enable the gate driving signal output end to output the gate driving signal at a high level;
- at a resetting stage of each display period, enabling, by the resetting circuit, the pull-up node to be electrically connected to the second voltage end, enabling, by the gate driving signal output end, the gate driving signal output end to be electrically disconnected from the clock signal input end under the control of the pull-up node, enabling, by the pull-down node control circuit, the pull-up node to be electrically connected to the first voltage end, and enabling, by the gate driving signal output circuit, the gate driving signal output end to be electrically connected to the third voltage end under the control of the pull-down node, to enable the gate driving signal output end to output the gate driving signal at a low level; and
- at an output cut-off maintenance stage of each display period, enabling, by the pull-down node control circuit, the pull-down node to be electrically connected to the first voltage end, and enabling, by the gate driving signal output circuit, the gate driving signal output end to be electrically connected to the third voltage end under the control of the pull-down node, to enable the gate driving signal output end to continuously output the gate driving signal at a low level.

13. A gate driving circuit comprising a plurality of shift register units according to claim 1 connected in a cascaded manner.

14. The gate driving circuit according to claim 13, wherein
- during forward scanning, apart from a first-level shift register unit, a signal input end of a current-level shift register unit is connected to a gate driving signal output end of a previous-level shift register unit, and apart from a last-level shift register unit, a resetting end of the current-level shift register unit is connected to a gate driving signal output end of a next-level shift register unit; and
- during backward scanning, apart from the last-level shift register unit, the signal input end of the current-level shift register unit is connected to the gate driving signal output end of the next-level shift register unit, and apart from the first-level shift register unit, the resetting end of the current-level shift register unit is connected to the gate driving signal output end of the previous-level shift register unit.

15. A display device, comprising the gate driving circuit according to claim 13.

* * * * *